US006550732B1

(12) United States Patent
Tuttle et al.

(10) Patent No.: US 6,550,732 B1
(45) Date of Patent: Apr. 22, 2003

(54) HEAT SINK RETENTION TECHNIQUE

(75) Inventors: Erick J. Tuttle, Fort Collins, CO (US); Ronald P Dean, Fort Collins, CO (US); Douglas A. Fleecs, Greeley, CO (US)

(73) Assignee: Hewlett Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/020,665

(22) Filed: Oct. 29, 2001

(51) Int. Cl.⁷ .............................................. A47B 96/00
(52) U.S. Cl. .................................. 248/225.21; 248/694
(58) Field of Search ............................. 248/694, 222.1, 248/200, 220.1; 361/697, 724

(56) References Cited

U.S. PATENT DOCUMENTS 6,249,428 B1 * 6/2001 Jeffries et al. .............. 361/684
6,301,111 B1 * 10/2001 Katsui ......................... 165/121
6,304,445 B1 * 10/2001 Bollesen ..................... 165/80.3
6,404,634 B1 * 6/2002 Mann .......................... 165/121

* cited by examiner

Primary Examiner—Ramon O. Ramirez
(74) Attorney, Agent, or Firm—Kevin M. Hart

(57) ABSTRACT

A heat sink retaining bracket having a first surface for engaging a heat sink and a second surface for engaging a chassis wall or other substantially rigid support member. The first surface may include an opening having a rim around its periphery. The rim may be adapted to engaged the top and sides of the heat sink such that sideways and upward translational movements are restrained. Air may pass through the opening as it enters or exits the heat sink so that the cooling efficiency of the heat sink is not substantially impaired by the bracket. The second surface may be adapted to engaged the chassis wall or support member using a hook-and-slot arrangement and a fastener or fasteners. In one embodiment, the fastener or fasteners may be applied in a compression mode. In another embodiment, the fastener or fasteners may be applied in a tension mode.

22 Claims, 10 Drawing Sheets

HEAT SINK RETENTION TECHNIQUE

FIELD OF THE INVENTION

This invention addresses unwanted movement of computer system components caused by mechanical shock and vibration.

BACKGROUND

In electronic equipment, shock and vibration can cause excessive movement of internal components. In general, the more massive the component, the more movement it will experience in response to shock and vibration. Heat sinks tend to be among the most massive components in a modem electronic systems. Their mechanical retention can be problematic.

The most common method used in the past for retaining heat sinks has been to screw or to bolt the bottom of the heat sink to a printed circuit board or to a structural member of an enclosure chassis. Such a retention scheme tended to add unwanted height to the heat sink assembly, and often required the use of numerous and massive fasteners. In addition, the prior art method sometimes required that some assembly steps be performed from the top of the work piece, and that some assembly steps be performed from the bottom. Consequently, the work piece often had to be flipped during the assembly process, adding time and complexity to its manufacture.

A need therefore exists for a new heat sink retention technique.

SUMMARY OF THE INVENTION

In one aspect, the invention includes a heat sink retaining bracket having a first surface for engaging a heat sink and a second surface for engaging a substantially rigid support member such as a chassis wall.

The first surface may include an opening having a rim around its periphery. The rim may be adapted to engaged the top and sides of the heat sink such that sideways and upward translational movements of the heat sink are restrained. Air may pass through the opening as it enters or exits the heat sink so that the cooling efficiency of the heat sink is not substantially impaired by the bracket.

The second surface may be adapted to engaged the chassis wall or support member using a hook-and-slot arrangement and a fastener or fasteners. Slots (or hooks) in the bracket may engaged hooks (or slots) on the wall or support member as the bracket is lowered onto the heat sink. A fastener or fasteners may then be applied to the bracket and the wall or support member so that the hooks and slots remain engaged. In one embodiment, a lip on the wall or support member may overhang the bracket, and the fastener or fasteners may be applied in a compression mode. In another embodiment, a portion of the bracket may overhang a lip on the wall or support member, and the fastener or fasteners may be applied in a tension mode.

DETAILED DESCRIPTION OF THE PREFERRED EMBODIMENTS

Figure 1:
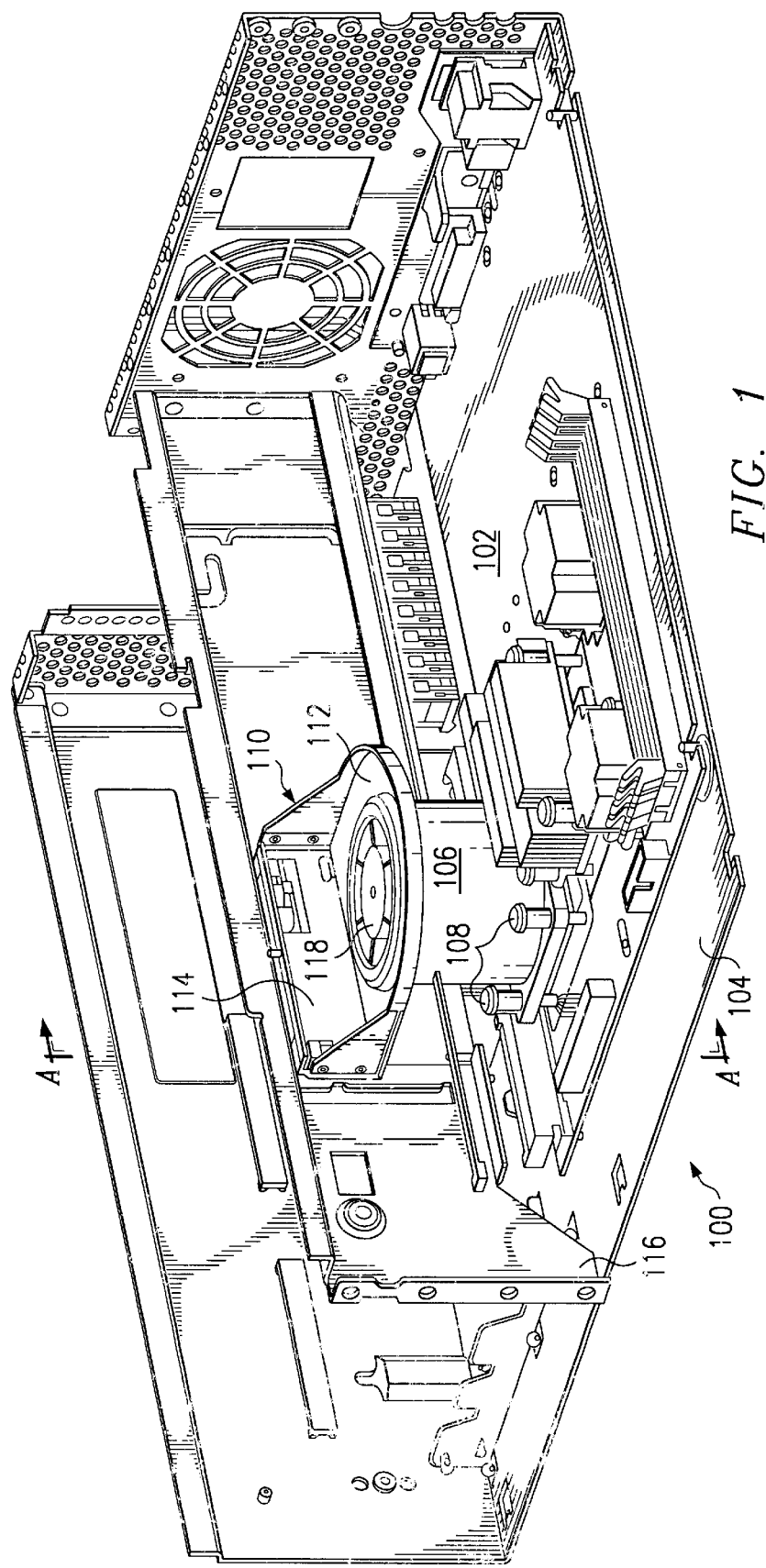
FIG. 1 is an oblique view of a computer chassis having a heat sink retaining bracket installed therein according to a preferred embodiment of the invention.

FIG. 1 illustrates a portion of a computer enclosure chassis 100. A printed circuit board 102 is mounted to chassis wall 104. A heat sink 106 is anchored to printed circuit board 102 by means of fasteners 108 located at the bottom of heat sink 106. Heat sink 106 may be anchored to chassis wall 104 in addition to or in lieu of printed circuit board 102. Heat sink retaining bracket 110 helps to restrain heat sink 106 from excessive movement due to shock and vibration. Heat sink 106 is shown in the illustration having a cylindrical shape with a fan 118 located at its top; in other embodiments, heat sink 106 may have alternative shapes, such as a rectangular shape, and fan 118 may be omitted or placed in an alternative location.

Heat sink retaining bracket 110 includes surface 112 for engaging heat sink 106 and surface 114 for engaging substantially rigid support member 116. In the embodiment shown, substantially rigid support member 116 is a chassis wall; in other embodiments, support member 116 may be any substantially rigid member defining or contained within the computer enclosure. Heat sink retaining bracket 110 may be formed using any suitably rigid material such as steel or aluminum, for example.

Figure 2:
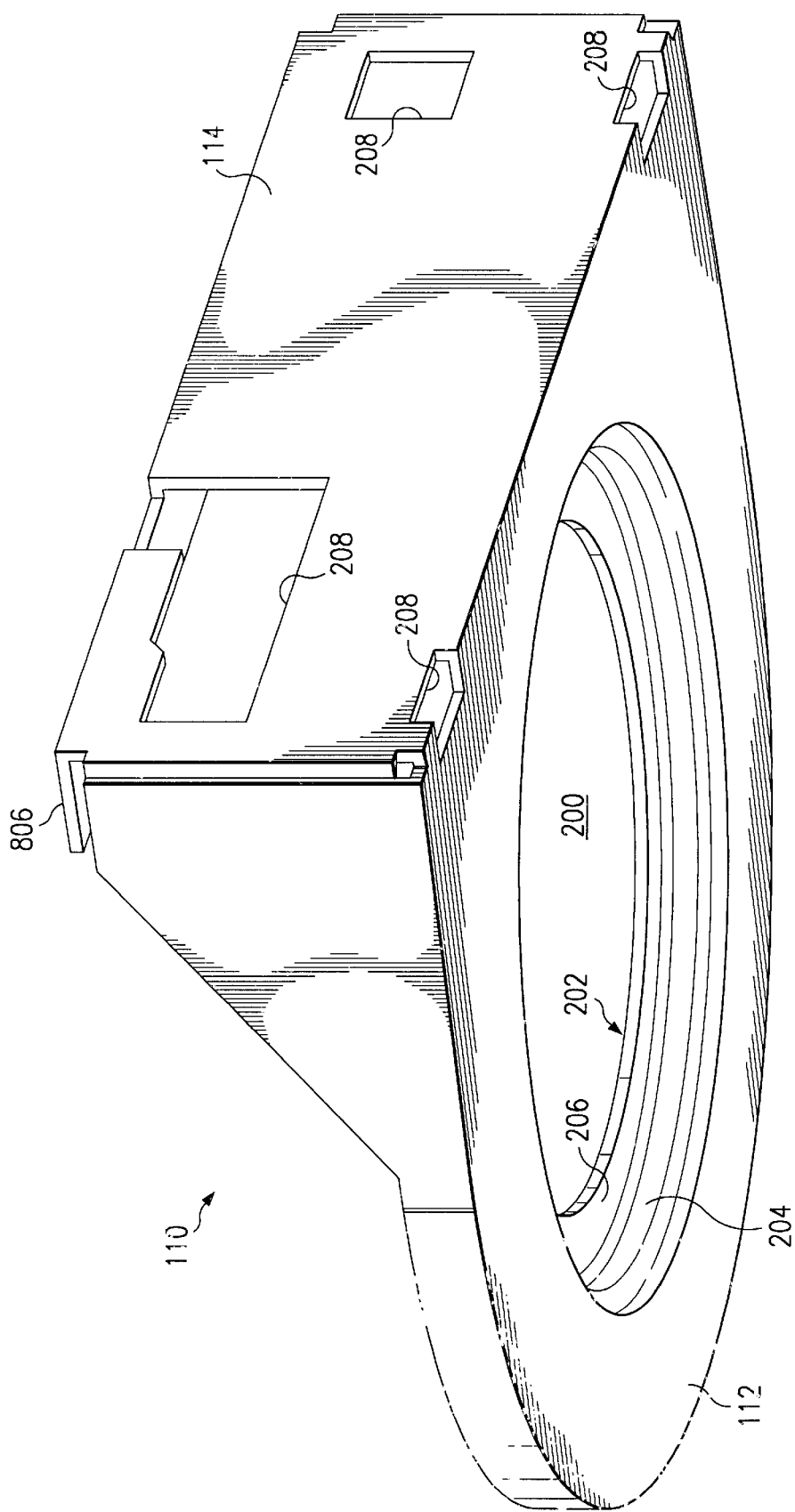
FIGS. 2 and 3 are rear and front oblique views, respectively, of the heat sink retaining bracket of FIG. 1.
Figure 3:
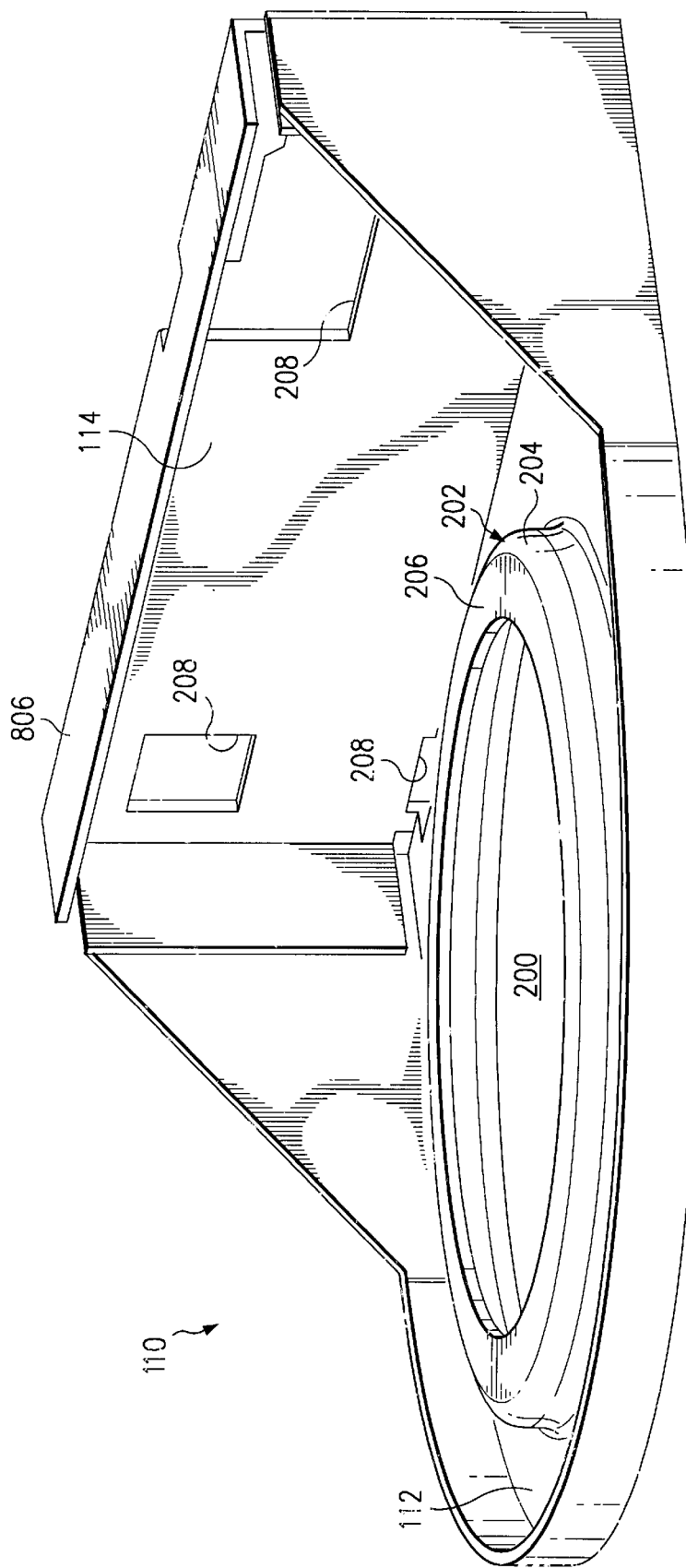

Referring now to FIGS. 2 and 3, surface 112 includes an opening 200 through which air may flow as it enters or exits heat sink 106. In the illustrated embodiment, opening 200 is circular so that it can accommodate a heat sink having a circular cross section. In alternative embodiments, opening 200 may have a different shape as needed to accommodate the shape of the heat sink. For example, the opening may be rectangular to accommodate a heat sink having a rectangular shape.

A rim 202 is disposed around the periphery of opening 200, as shown. Rim 202 is adapted to engage a side surface and a top surface of heat sink 106. In the embodiment shown, rim 202 includes a vertical section 204 for engaging the sides of heat sink 106, and a horizontal section 206 for engaging the top of heat sink 106. In this manner, rim 202 is able to restrain heat sink 106 against sideways and upward translational movements.

Figure 4:
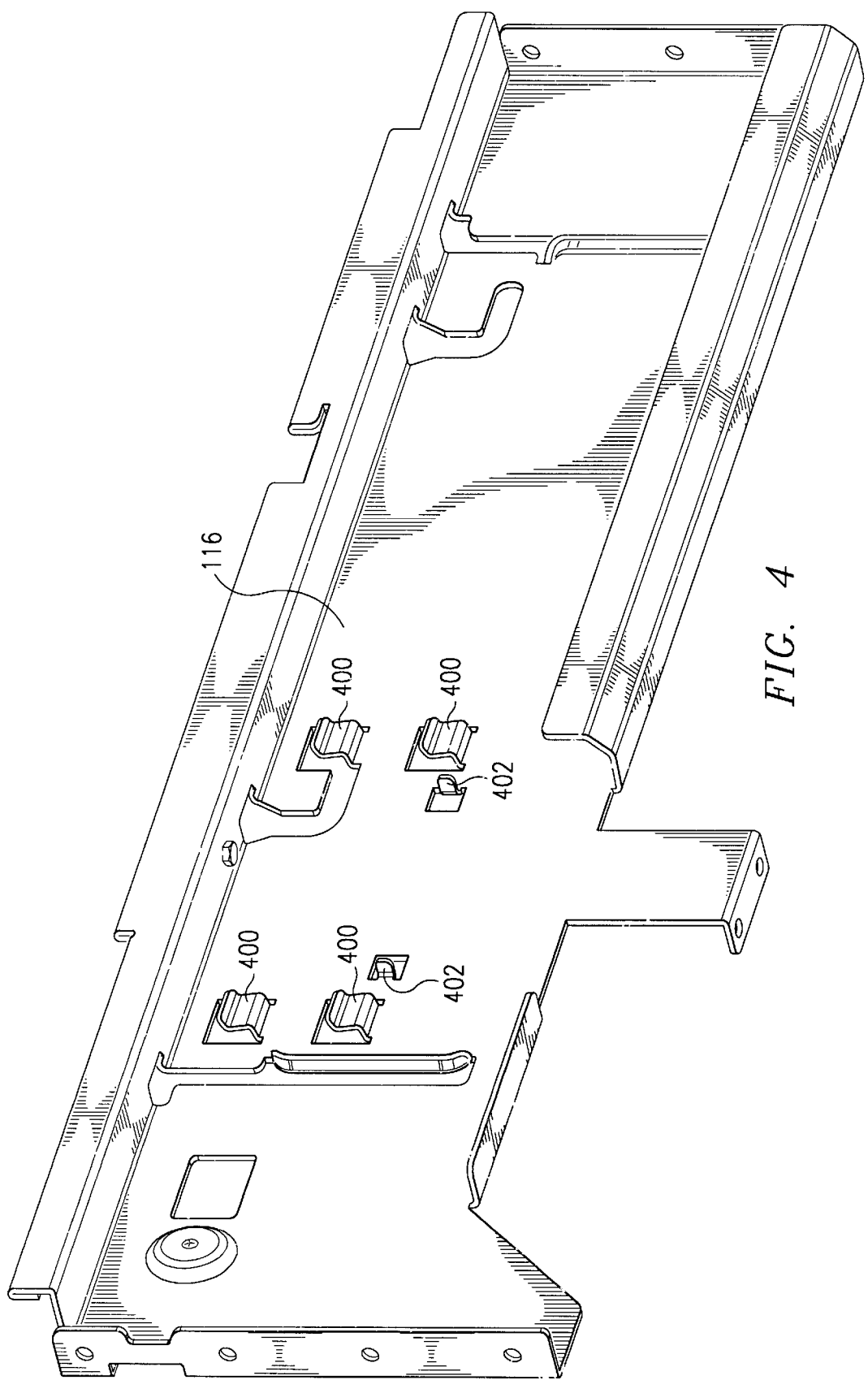
FIG. 4 is an oblique view of the wall of the computer chassis of FIG. 1 against which the heat sink retaining bracket of FIG. 1 is anchored.
Figure 5:
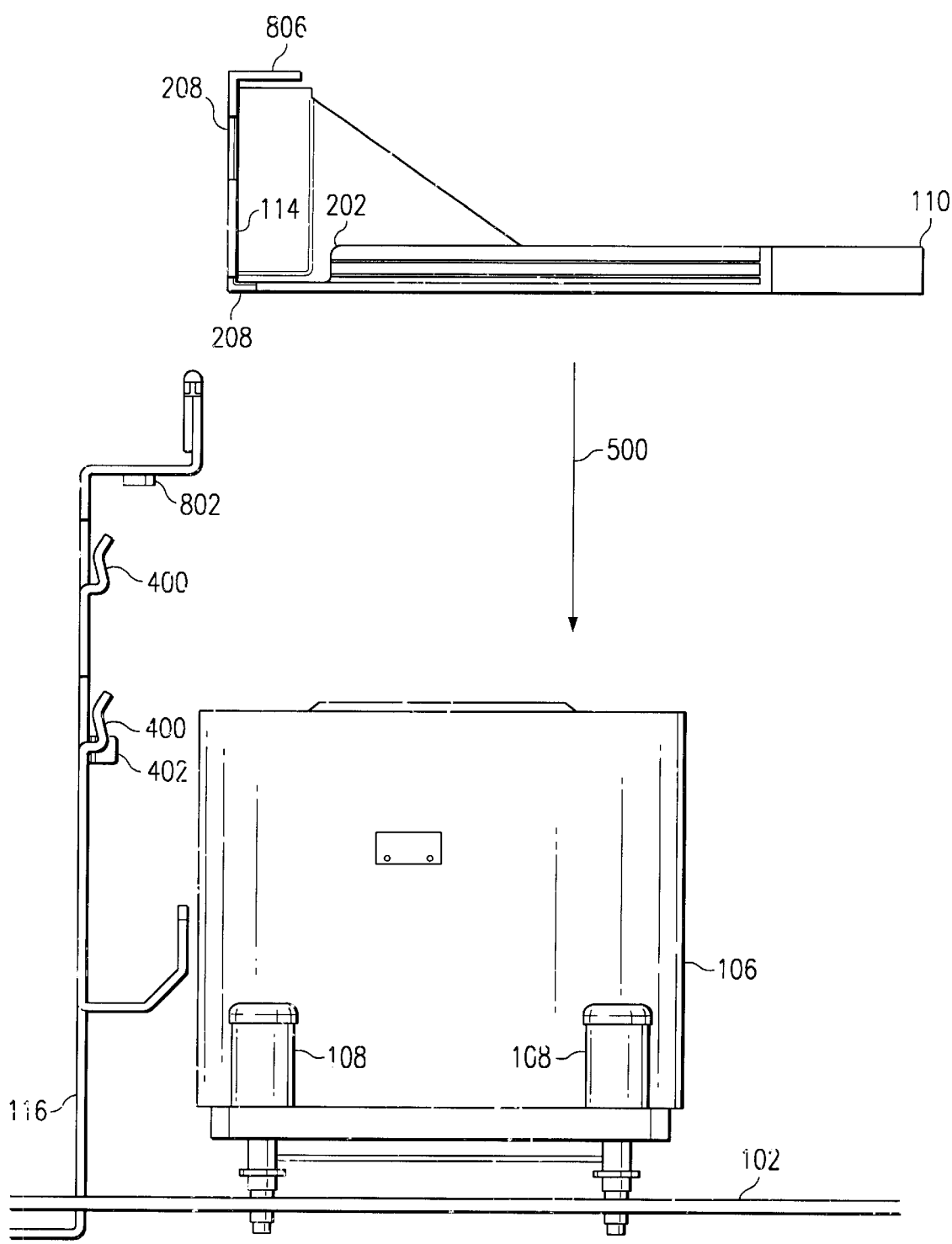
FIGS. 5–8 are sectional side views illustrating a method of installing and removing the heat sink retaining bracket of FIG. 1 according to a preferred embodiment of the invention.
Figure 6:
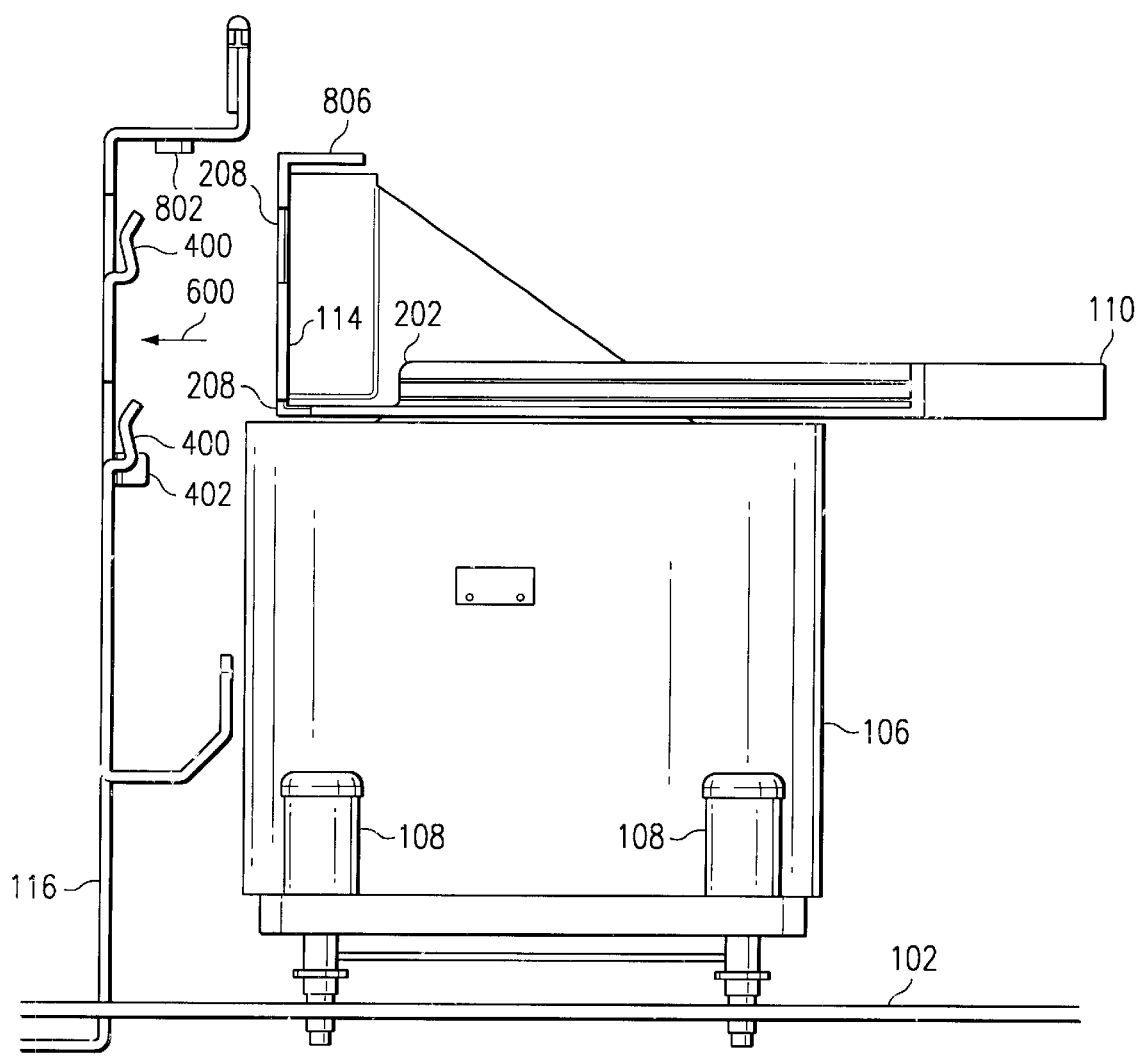
Figure 7:
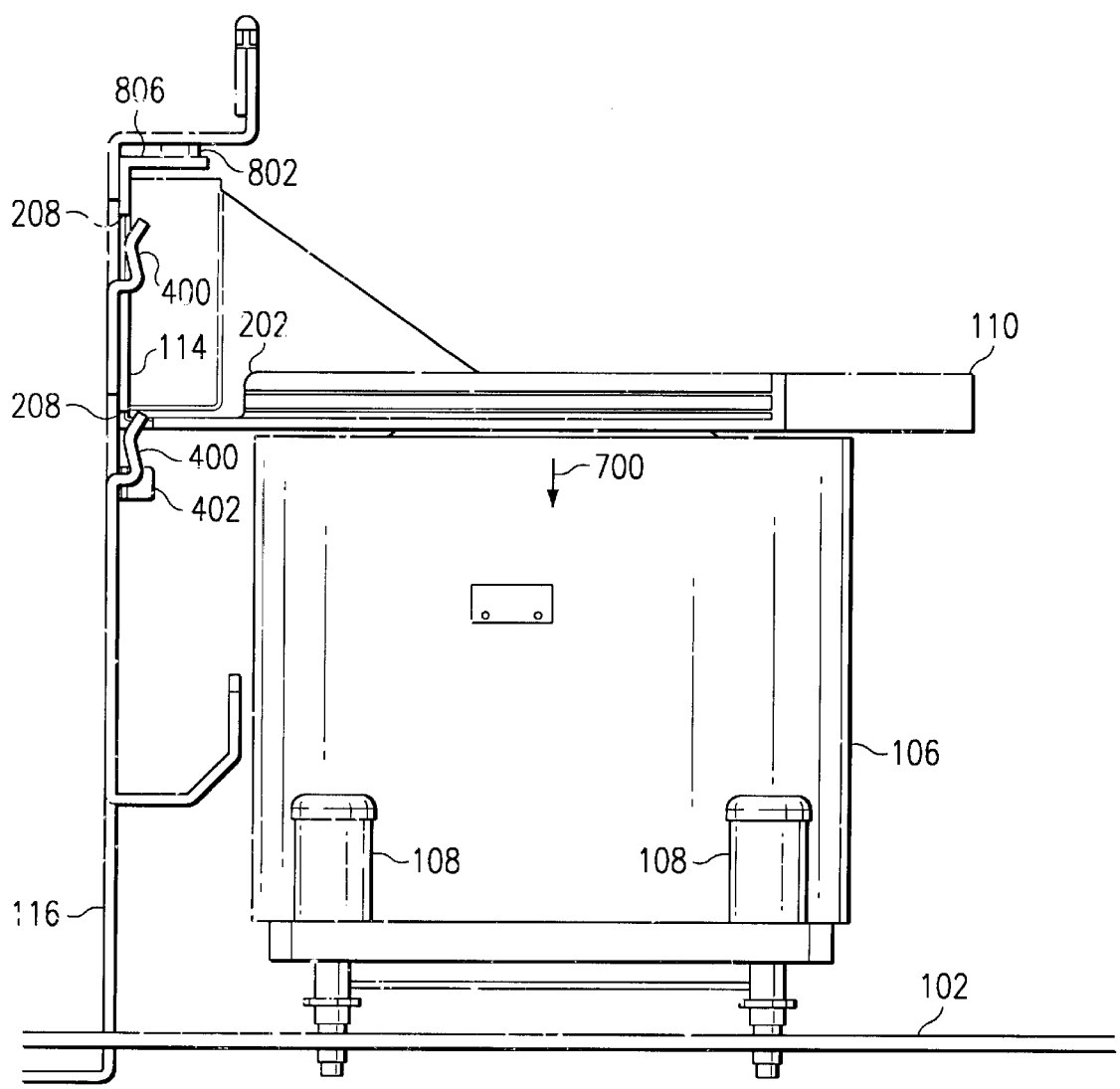

Surface 114 includes at least one slot 208 for engaging a corresponding hook 400 (see FIG. 4) on support member 116. In alternative embodiments, one or more slots 208 may be formed in support member 116, and corresponding hooks 400 may formed on surface 114.

Figure 8:
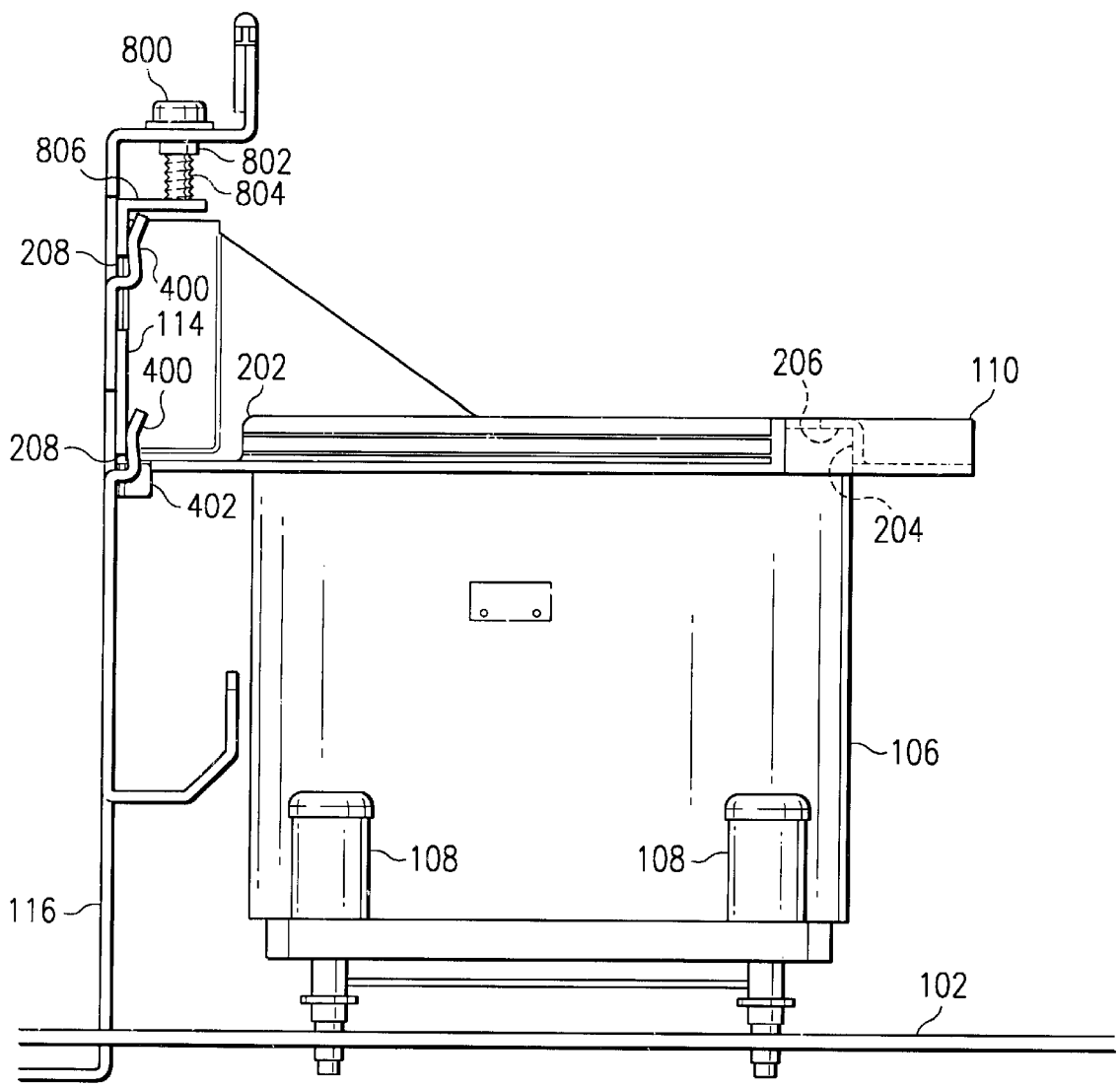

FIGS. 5–8 illustrate a preferred method for installing (or removing) retaining bracket 110. In FIGS. 5–8, the view is that of section A—A indicated in FIG. 1. Thus, a portion of bracket 110 is cut away so that the engagement between hooks 400 and slots 208 may be seen more easily. First, bracket 110 may be lowered in direction 500 from the position shown in FIG. 5 to the position shown in FIG. 6, just above heat sink 106. From there, bracket 110 may be moved in direction 600 from the position shown in FIG. 6 to the position shown in FIG. 7 such that slots 208 have cleared hooks 400 and the outer side of surface 114 contacts support member 116. From there, bracket 110 may be lowered in direction 700 from the position shown in FIG. 7 to the position shown in FIG. 8 such that hooks 400 have engaged the inner side of surface 114 and rim 202 has engaged the sides and top of heat sink 106. Specifically, as shown in FIG. 8, the vertical section 204 engages the sides of heat sink 106, and the horizontal section 206 engages the top of heat sink 106. Once bracket 110 is in this position, a fastener 800 may be applied as shown in FIG. 8. Fastener 800 may be any suitable fastener such as a screw or bolt. In the embodiment shown, it is applied through a fastener hole 802 formed in support member 116 and engages a surface 806 on bracket 110, pushing surface 806 downward in direction 700 and tending to keep hooks 400 engaged with surface 114. Thus, in the embodiment, the portion 804 of the fastener 800 is in compression.

Figure 9:
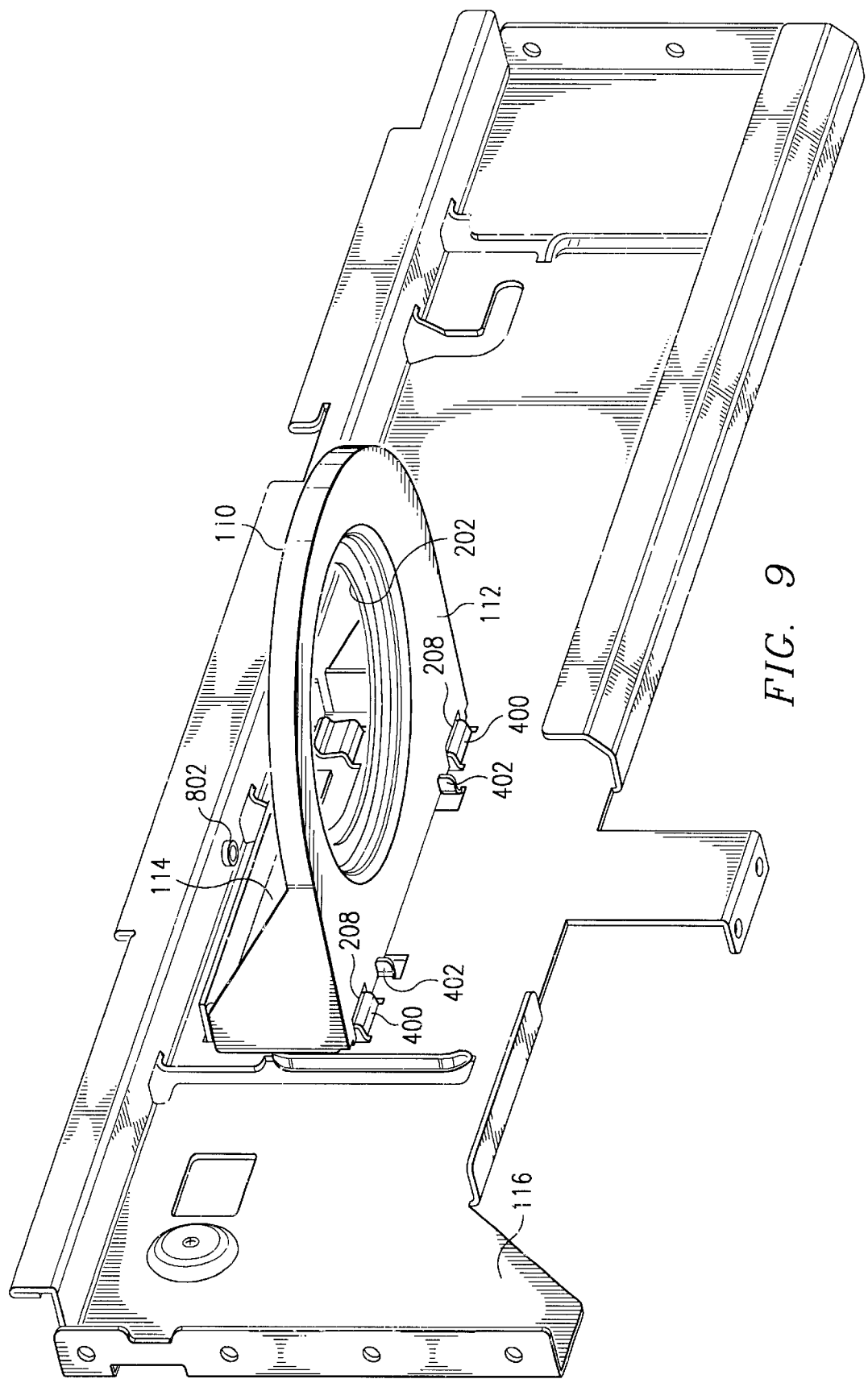
FIG. 9 is an oblique view showing only the heat sink retaining bracket of FIG. 1 anchored to the wall of FIG. 4 for purposes of illustration.

An optional set of stop tabs 402 are shown in the illustrations. If such stop tabs are employed, they may be located so that the bottom of bracket 110 will rest against them when hooks 400 and slots 208 are engaged, as shown in FIG. 9.

Figure 10:
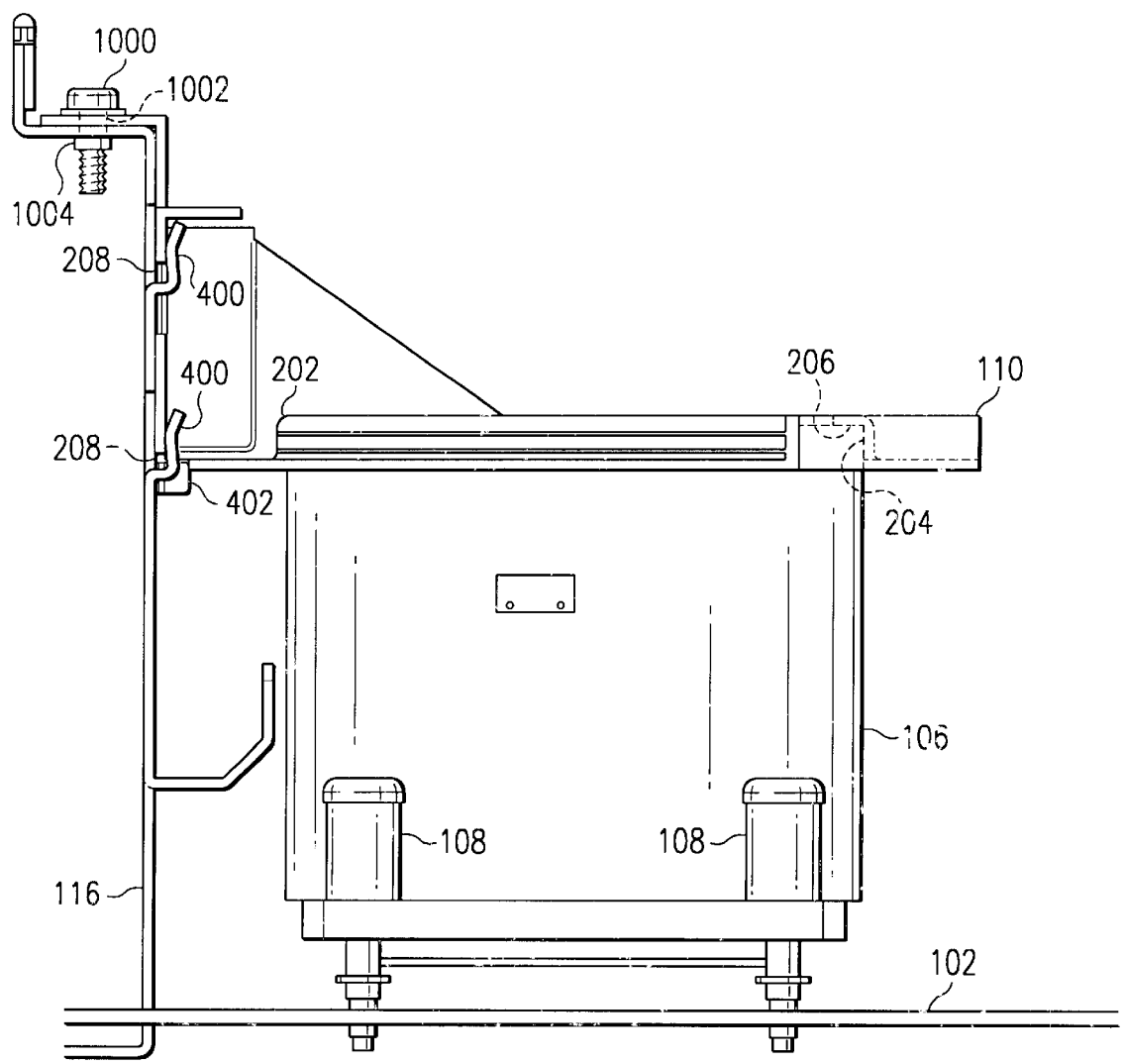
FIG. 10 is a sectional side view of a heat sink retaining bracket anchored to a chassis wall according to an alternative preferred embodiment of the invention.

In an alternative embodiment shown in FIG. 10, a fastener 1000 (such as a screw or bolt) is applied through a fastener hole 1002 formed in bracket 110 and through a fastener hole 1004 formed in support member 116. Like fastener 800, fastener 1000 urges bracket 110 downward in direction 700. Unlike fastener 800, the portion of fastener 1000 between holes 1002 and 1004 is in tension. In yet further embodiments, fasteners 800 and 1000 need not be oriented vertically as they are shown in the illustrated embodiments; rather, they may be oriented horizontally or otherwise as necessary or convenient for helping to keep hooks 400 and slots 208 engaged.

What is claimed is:

1. A heat sink retaining bracket for retaining a heat sink, comprising:
   a first surface for engaging the heat sink; and
   a second surface for engaging a substantially rigid support member;
   wherein the first surface comprises:
      an opening adapted to allow air to flow through the bracket to or from the heat sink; and
      a rim, disposed around the periphery of the opening, adapted to engage a side surface and a top surface of the heat sink.

2. The heat sink retaining bracket of claim 1, wherein the second surface comprises:
   at least one slot for engaging a hook on the substantially rigid support member.

3. The heat sink retaining bracket of claim 1, further comprising:
   a fastener;
   a fastener hole in the substantially rigid support member adapted to receive the fastener; and
   a third surface on the bracket adapted to engage the fastener;
   wherein the portion of the fastener between the fastener hole and the third surface is in compression.

4. The heat sink retaining bracket of claim 1, further comprising:
   a fastener;
   a first fastener hole in the substantially rigid support member adapted to receive the fastener; and
   a second fastener hole in the bracket adapted to receive the fastener;
   wherein the portion of the fastener between the first and second fastener holes is in tension.

5. The heat sink retaining bracket of claim 1, wherein the second surface comprises:,
   at least one hook for engaging a slot in the substantially rigid support member.

6. The heat sink retaining bracket of claim 1, wherein:
   the opening is circular.

7. The heat sink retaining bracket of claim 1, wherein:
   the opening is rectangular.

8. The heat sink retaining bracket of claim 1, wherein:
   the substantially rigid support member is a chassis wall.

9. A heat sink retaining bracket for retaining a heat sink, comprising:
   a first surface for engaging the heat sink; and
   a second surface for engaging a substantially rigid support member;
   wherein the second surface comprises:
      at least one slot for engaging a hook on the substantially rigid support member.

10. The heat sink retaining bracket of claim 9, wherein:
    the first surface comprises:
       an opening adapted to allow air to flow through the bracket to or from the heat sink; and
       a rim, disposed around the periphery of the opening, adapted to engage a side surface and a top surface of the heat sink.

11. The heat sink retaining bracket of claim 10, wherein:
    the opening is circular.

12. The heat sink retaining bracket of claim 10, wherein:
    the opening is rectangular.

13. The heat sink retaining bracket of claim 9, further comprising:
    a fastener;
    a fastener hole in the substantially rigid support member adapted to receive the fastener; and
    a third surface on the bracket adapted to engage the fastener;
    wherein the portion of the fastener between the fastener hole and the third surface is in compression.

14. The heat sink retaining bracket of claim 9, further comprising:
    a fastener;
    a first fastener hole in the substantially rigid support member adapted to receive the fastener; and
    a second fastener hole in the bracket adapted to receive the fastener;
    wherein the portion of the fastener between the first and second fastener holes is in tension.

15. The heat sink retaining bracket of claim 9, wherein:
    the substantially rigid support member is a chassis wall.

16. A heat sink retaining bracket for retaining a heat sink, comprising:
    a first surface for engaging the heat sink; and
    a second surface for engaging a substantially rigid support member;
    wherein the second surface comprises:
       at least one hook for engaging a slot on the substantially rigid support member.

17. The heat sink retaining bracket of claim 16, wherein:
    the first surface comprises:

an opening adapted to allow air to flow through the bracket to or from the heat sink; and a rim, disposed around the periphery of the opening, adapted to engage a side surface and a top surface of the heat sink.

18. The heat sink retaining bracket of claim 17, wherein:

the opening is circular.

19. The heat sink retaining bracket of claim 17, wherein:

the opening is rectangular.

20. The heat sink retaining bracket of claim 16, further comprising:

a fastener;

a fastener hole in the substantially rigid support member adapted to receive the fastener; and a third surface on the bracket adapted to engage the fastener;

wherein the portion of the fastener between the fastener hole and the third surface is in compression.

21. The heat sink retaining bracket of claim 16, further comprising:

a fastener;

a first fastener hole in the substantially rigid support member adapted to receive the fastener; and a second fastener hole in the bracket adapted to receive the fastener;

wherein the portion of the fastener between the first and second fastener holes is in tension.

22. The heat sink retaining bracket of claim 16, wherein:

the substantially rigid support member is a chassis wall.

* * * * *